United States Patent [19]

Dobisz et al.

[11] Patent Number: 5,336,892
[45] Date of Patent: Aug. 9, 1994

[54] METHOD AND SYSTEM FOR ELECTRON BEAM LITHOGRAPHY

[75] Inventors: Elizabeth A. Dobisz, Owings; Christie R. K. Marrian, Marbury; Martin C. Peckerar; Kee W. Rhee, both of Silver Springs, all of Md.

[73] Assignee: The United States of America as represented by the Secretary of the Navy, Washington, D.C.

[21] Appl. No.: 882,230

[22] Filed: May 13, 1992

[51] Int. Cl.[5] .............................................. H01J 3/40
[52] U.S. Cl. .................................. 250/492.2; 250/398
[58] Field of Search ............... 250/442.2, 398, 310; 430/296; 437/928

[56] References Cited

U.S. PATENT DOCUMENTS

| | | | |
|---|---|---|---|
| 3,580,749 | 5/1971 | Simon et al. | 250/492.2 |
| 3,688,389 | 9/1972 | Nakamura et al. | 250/492.2 |
| 3,900,737 | 8/1975 | Collier et al. | 250/492.22 |
| 4,463,265 | 7/1984 | Owen et al. | 250/492.2 |
| 5,147,823 | 9/1992 | Ishibashi et al. | 437/928 |

*Primary Examiner*—Paul M. Dzierzynski
*Assistant Examiner*—Kiet T. Nguyen
*Attorney, Agent, or Firm*—Thomas E. McDonnell; George A. Kap

[57] ABSTRACT

Improvement of resolution in terms of reducing minimum feature sizes and proximity effects on bulk substrates in high voltage electron beam lithography as applied to manufacture of electronic circuits from coated semiconductors involves the use of a dielectric layer interposed between an electrically semiconducting substrate and a resist layer. The dielectric layer functions to reduce the resist exposure resulting from the backscattered electrons coming from the substrate into the resist layer.

13 Claims, 2 Drawing Sheets

ELECTRON BEAM  *16*

RESIST  *14*

DIELECTRIC FILM  *12*

BULK SUBSTRATE  *10*

METHOD AND SYSTEM FOR ELECTRON BEAM LITHOGRAPHY

FIELD OF INVENTION

This invention pertains to reduction of minimum feature sizes and proximity effects. More specifically, this invention relates to improving resolution in electronic circuits by reduction or elimination of resist exposure resulting from backscattered, fast secondary, and secondary electrons in high voltage electron beam lithography.

DESCRIPTION OF PRIOR ART

In electron beam lithography, a substrate which is to be patterned is covered by a thin layer of resist, which is sensitive to electron irradiation supplied by an electron beam incident on the resist. These electrons decelerate as they pass through the resist thereby depositing energy in the resist along the trajectories of each of these electrons. The energy deposited in this way in known as "forward scattered" energy and has a bell shaped distribution curve which is a function of the lateral displacement from the center of the beam.

Electrons in an electron beam should pass entirely through the resist layer and into the substrate so that the entire thickness of the resist layer can be exposed by an electron beam. If the initial energy of the incident electrons is such that the electrons come to rest in the resist, then charge builds up in those localized regions where the electron beam is incident on the resist. Because localized regions of charge in the resist deflect the electron beam, portions of the circuit pattern which have already been written affect portions of the circuit pattern which are subsequently written. Such deflection results in errors in the pattern which is etched into the substrate. Therefore, energy of the incident electrons should be chosen to be sufficient to insure that the electrons pass through the resist layer into the substrate. Because conductivity of the substrate is typically much higher than that of resist, a localized charge build-up in the substrate will not result or can be dissipated by grounding the substrate. Generally, energy on the order of 10 keV is sufficient to insure that the electrons pass into the substrate.

Unfortunately, a significant fraction of incident electrons are backscattered into the resist film from the substrate and produce an undesirable exposure of the resist layer. This effect has been reported in connection with 20 keV electron beam incident on a 0.4 micron thick resist layer of polymethylmethacrylate (PMMA) on top of a silicon substrate. The energy deposited in the resist by the backscattered electrons has a bell-shaped distribution, which is a function of lateral displacement from the center of the electron beam. The extra exposure of the resist by these backscattered electrons causes proximity effects, which affect resolution of lithographic features on the order of a micrometer (micron) or less.

The resolution in electron beam lithography is degraded by forward scattering of the primary electron beam in the resist and backscattering of the electron beam from the substrate. The forward and backscattered electrons generate secondary and fast secondary electrons which also cause proximity effects, expose the resist, and degrade the resolution. The forward scattering is minimized by the use of thin resist and high energy electron probes. The most widely employed strategy to reduce backscattered electron effects is to employ a high energy electron beam which penetrates deep into the substrate. The backscattered electrons are widely dispersed over an area much larger than the incident probe diameter and the resulting backscattered electron dose forms a uniform "fog" one or more orders of magnitude lower than the dose from the primary electron beam. This technique works for low Z or low density or low atomic number substrates, such as silicon (Si) and a few resists, such as (PMMA).

U.S. Pat. No. 4,463,265 to Owen et al attempts to correct for the undesirable exposure due to backscattered electrons by reversed field pattern exposure. In lines 16-20, col 3, and claim 4 of this patent, reference is made to an electron absorbing layer between the resist layer and the substrate to reduce amount of backscattered energy.

SUMMARY OF INVENTION

It is an object of this invention to correct undesirable exposure of a resist due to backscattered, fast secondary and secondary electrons in electron beam lithography.

It is another object of this invention to negate effect of backscattered electrons on a resist in high voltage or high energy electron beam lithography.

It is another object of this invention to reduce or eliminate the detrimental effect of backscattered electrons in direct write and projection electron beam lithography as opposed to mask fabrication.

It is another object of this invention to reduce linewidths and to reduce or eliminate proximity effects in electronic circuits.

It is another object of this invention to improve resolution in electronic circuits produced by exposing single level resist layer by means of direct write or projection electron beam lithography.

These and other objects of this invention are accomplished by a coated semiconductor which is composed of a substrate, a dielectric layer disposed directly on the substrate, and a resist layer disposed directly on the dielectric layer. The dielectric layer appears to block or deflect backscattered, fast secondary and secondary electrons from entering the resist layer from the substrate causing undesirable resist exposure.

DETAILED DESCRIPTION OF INVENTION

Figure 1:
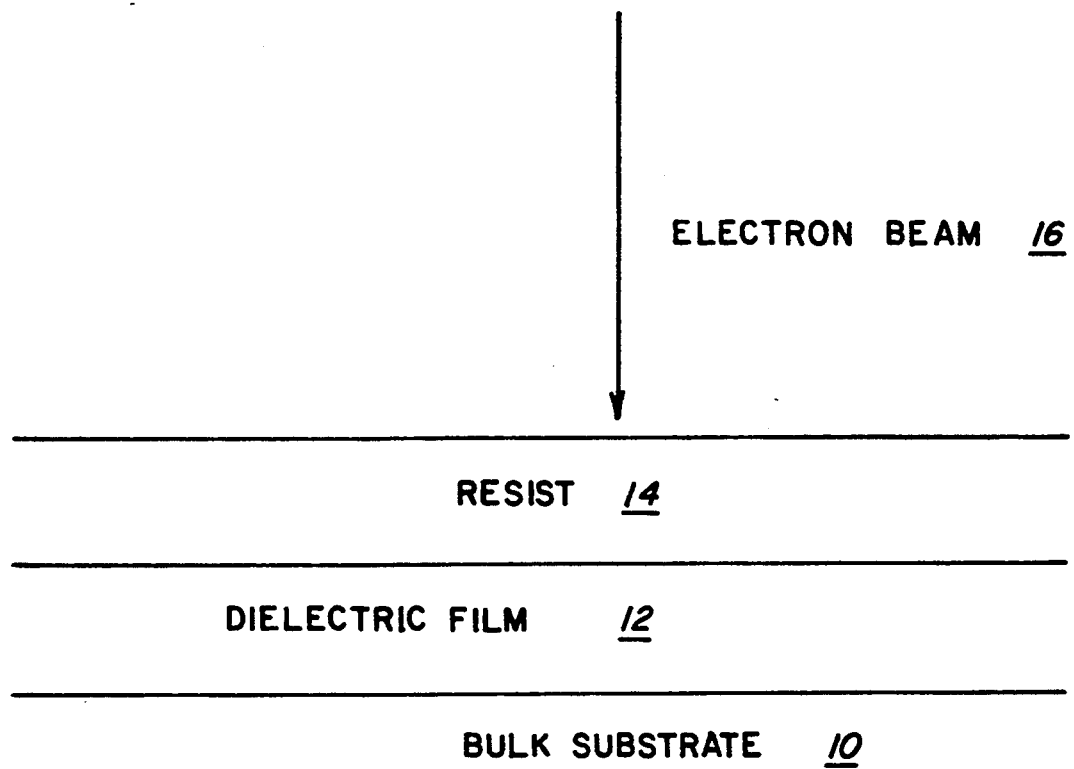
FIG. 1 is schematic diagram of a substrate, a thin layer of a dielectric material disposed on the substrate, a thin resist layer disposed on the dielectric material, and an incident electron beam impinging on the resist layer.

FIG. 1 more specifically illustrates the invention herein which comprises substrate 10 having disposed directly thereover dielectric layer 12, and resist layer 14 is directly disposed on the dielectric layer 12. Electron beam 16 is a high voltage beam of electrons which impinges directly on the resist layer 14 and is used to directly write a circuit pattern on the monolevel resist surface.

The purpose of the dielectric layer is to improve resolution of electronic circuits. In high voltage electron beam direct write lithography, the electrons which are backscattered from the substrate create fast secondary and secondary electrons which, together with the backscattered electrons, are deflected or shielded by the dielectric layer and thus are prevented from entering the resist layer. If the backscattered electrons, fast secondary and secondary electrons were allowed to enter the resist layer, the electrons, depending on their energy, would expose a portion of the resist and thus would impair the structural integrity of the lines written on the resist by an electron beam. As used hereinafter, the term "backscattered electrons" includes all electrons entering the resist from below the resist and includes fast secondary and secondary electrons. Structural integrity manifests itself in the desire to have sharp edges with no exposure between the areas where the resist is to be exposed.

The dielectric layer is composed of a dielectric material which is a nonconductor to electricity. It also must be able to be deposited in a facile manner on a substrate in a relatively thin layer or film and be generally compatible with existing batch processing in the manufacture of integrated circuits. The dielectric layer serves as barrier to backscattered electrons. It is transparent to incident beam electrons. Thickness of the dielectric layer can vary from about 1 to about 1000 nanometers (nm), preferably 10–400 nm.

Deposition of the dielectric layer on a suitable substrate pursuant to the invention herein can be accomplished in any suitable manner including spinning, spraying, dip-coating, and chemical vapor deposition. Any insulator compatible with standard semiconductor processing technology which does not act as a source of backscatter or secondary electrons can be used as a dielectric material. Although any dielectric material can be used as the dielectric layer, the presently preferred dielectric materials are silicon nitride ($Si_3N_4$) and silica ($SiO_2$) which are preferably applied to the substrate by chemical vapor deposition due to their physical state. Other non-stoichiometric silicon nitrides ($SiN_x$) and silicon oxides ($SiO_x$) are also preferred.

Chemical vapor deposition processes create a thin film on the surface of a workpiece or a substrate through the pyrolytic decomposition and subsequent surface reaction of molecules introduced as a gas. Control of gas flow, temperature, and base pressure are emphasized to get uniformity of film thickness and properties. It is desirable to use lamp energy in chemical vapor deposition since such energy is deposited only on the surface of a substrate and the substrate is not heated through its depth. This can reduce warpage and minimize dopant redistribution effects. Both crystalline and non-crystalline materials can be grown in this manner. Systems used for growth of crystalline materials are generally operated at about 1100° C. whereas for polycrystalline or amorphous materials, lower operating temperature is used.

Some variants on chemical vapor deposition involve the use of lasers. Such variants use intense, focused laser beam to initiate chemical vapor deposition surface reaction which can be initiated through local heating effects or the surface bonding configuration can be changed and made more reactive by light-matter interaction. A deposition of a number of materials is possible using this technique.

Dielectric layers deposited by high and low temperature processes have been found to work pursuant to the invention disclosed herein.

Any resist material can be used as the resist layer in the invention disclosed herein. Resist that exhibit tens-of-nanometer resolution, good adhesion to the underlying dielectric layer, good degree of process compatibility, and thickness variations of less than 10 nm are available. The resist thickness contemplated by this invention is from about 1 nm to about 5 microns (micrometers), preferably from about 10 nm to about 1 micron.

The resists generally fall into two broad classes of positive and negative resists. These resist are radiation-sensitive thin films. Positive-acting resists become more soluble in the developing solvent after exposure, which is caused by a deprotection or a bond scission reaction resulting from photon or electron interaction. Negative resists become less soluble after exposure through light-induced or electron-induced crosslinking. If a small region of a negative resist is exposed, only the exposed region will be covered by the resist after development. The positive resist works in the directly opposite way, i.e., if a small region of a positive resist is exposed, only the exposed region will be removed or washed-out after development.

The highest resolution commercially available positive resist is poly(methylmethacrylate) or PMMA, however, it has a very limited etch resistance which makes it incompatible with many pattern transfer techniques. The reason poly(methylmethacrylate) is a positive resist is because it engages in bond scission when exposed to any exposing medium such as electron beams, x-rays, or deep ultraviolet radiation. Negative resist are attractive for reverse tone patterning and several negative resist are very robust as masks to subsequent etching. However, the highest resolution negative resists do not exhibit resolution as high as that of poly(methylmethacrylate) positive resist. The poorer resolution of negative resists is believed to be due to post exposure processing required of negative resists. An example of a commercially available, high resolution negative resist is SAL-601-ER7 from Shipley Company, which is a chemically amplified novolac resin.

The resist can be applied onto a workpiece or the dielectric layer disposed on a substrate in any suitable manner including spinning, spraying or dip-coating. Thickness of the resist is about 50 to 1000 nm, preferably 200 to 600 nm. In ultrahigh resolution work, i.e., sub-hundred nanometers, thin resists are preferred with thickness of less than 200 nm.

In the spinning method, the coated substrate or a wafer is placed in a vacuum chuck capable of holding it securely while the coated substrate is spun at a high speed of about 1–10 kilo RPM. The resist material is applied to the surface of the coated substrate prior to spinning. During spinning, excess resist material is flung off the coated substrate surface and surface tension pulls the remaining film flat. Resist layer can also be sprayed on the coated substrate or the workpiece can be dip-coated, if physical state of the resist layer permits it. Prior to any application of the resist layer, the coated substrate can receive a dehydration bake at about 200° C. to remove water vapor. The final thickness of the resist layer is determined by the spin speed as well as by resist layer composition, mean molecular weight, and its viscosity.

The spinning technique provides films of exceptional uniformity. Better than 10 nm thickness control can be obtained and this can be verified by ellipsometry on a flat substrate.

Generally, a substrate is the physical material on which patterns are fabricated. For example, semiconductor and ferrite substrates provide useful electronic functions. Metallic, ceramic, plastic, and glass substrates have been used, as well as composites thereof. More specifically, a substrate is a semiconducting supporting material upon which or within which an integrated circuit is fabricated or to which an integrated circuit is attached. A substrate is an electrical semiconductor which provides isolation for circuit components and has good thermal conductivity for heat removal.

A suitable substrate material is 96% aluminum oxide ($Al_2O_3$) or alumina. It is a ceramic capable of withstanding the high temperatures required especially for thick-film processing. Alumina is available in sizes ranging from tiny chips to large circuit boards. It can be fabricated in a variety of shapes, and the fired sheets can be drilled or cut with diamond tools or a laser beam.

Beryllium oxide (BeO) or beryllia and 99% alumina are also suitable as substrate materials. The 99% alumina has a smoother surface than the 96% alumina, and it is primarily used for thin-film deposition. It is used for thick-film work only when thin and thick films have to be deposited on the same substrate. Beryllia has a high thermal conductivity and can be used as replacement for alumina in critical design situations.

Other suitable substrate materials include porcelain-enameled metals, cofired porcelain ceramics, glass, quartz, oxidized-silicon, sapphire, and ferrite.

Many technologically important substrate materials have high atomic number or high density, such as semiconducting silicon (Si) and gallium arsenide (GaAs). Gallium arsenide has a high backscatter coefficient for high energy electrons because of its high atomic number or density. Because of its high atomic number, gallium arsenide is a strong emitter of secondary and fast secondary electrons. Gallium arsenide crystals can be prepared by molecular-beam epitaxy (MBE). This process involves the reactions of a few atoms or molecules with a heated substrate maintained in a high vacuum of about $10^{-11}$ Torr. The substrate temperatures are in the range of 500° to 900° C. The MBE process is capable of depositing layers of chemical compositions as well as doping profiles with precise control. The process is capable of achieving thin layers with ultrasmall dimensions on the order of atomic layers. The MBE process consists of several effusion ovens enclosed in a well-controlled pressure (vacuum) chamber and can generally handle various III–V compounds. The temperature of each effusion oven is adjusted to provide the desired evaporation rate, and effusion oven shutters control the flow rate. The substrate is mounted on a holder that rotates continuously to provide control of thickness deposition. The dopants can be precisely incorporated and controlled to achieve the desired doping profile.

The gallium substrate can also be made by liquid phase epitaxy, organometallic vapor deposition, and other techniques. Silicon substrates can be prepared by similar techniques.

The preferred substrates are planar and self-supporteng. Thickness of the substrates can be varied in response to a particular situation. For purposes herein, however, substrate thicknesses in excess of 100 nm are contemplated, preferably 200 to 800 nm.

Lithographic resolution in electronic circuits is believed to be limited by effects of backscattered fast secondary and secondary electrons, diffusion of acid catalyst, and inherent resolution resist materials. In the situation describe herein, i.e., high voltage electron beam lithography, it is only the backscattered electrons which are believed to negatively or undesirably affect resolution. Therefore, this invention relates to reducing or eliminating the undesirable effects of backscattered, fast secondary and secondary electrons. The effect of backscattered electrons refers to that produced by electrons entering the resist layer from regions below the resist layer. These electrons include those elastically scattered from the substrate into the resist and the effects of fast secondary and secondary electrons, which are produced by inelastic collisions experienced by primary or elastically backscattered electrons. The secondary electrons result from many electronic processes and have energy of less than 50 eV. The secondary electrons do not travel more than about 5 nm and do not critically limit the resolution. The fast secondaries result from electronic core processes in the substrate material and are on the order of 100–3000 eV. The fast secondaries can travel distances of up to 500 nm and are detrimental to the resolution. The dielectric layer deflects fast secondaries, which cause undesirable exposure in electronic circuits in many electronic devices.

An alternative method of improving lithographic resolution is to use a low energy primary electron beam. Incident electrons of 15 to 50 eV do not produce high energy scattered electrons. With a low voltage electron beam, generated by a scanning tunneling microscope, the high resolution of SAL-601 resist has been demonstrated with 22 nm linewidths on Si substrates and 35 nm linewidths on GaAs-substrates. At high voltage, lines of 80 nm linewidths have been written on Si and GaAs substrates. A strong substrate dependance at high voltages of linewidth on dose is further evidence that the resolution is determined by electron scattering rather than by post exposure processing of the resist. However, due to technological challenges, low voltage probes have not been demonstrated in manufacturing or electronic circuit fabrication environment. For purposes herein, high voltage or high voltage electron beam lithography operates at a voltage of about 1 to 500 keV, preferably 10 to 100 keV. Present commercial electron beam lithography systems generate electron beams at a voltage of about 20 to 50 keV.

The invention herein pertains to the interposition of a dielectric material between a resist layer and the substrate in order to shield or prevent the backscattered electrons from entering or reentering the resist layer. With the dielectric film disposed between a substrate and a resist, the linewidth of a lithographic pattern can be reduced by 10 to 50%, most often about 30%. With the interposed dielectric film, it is also possible to eliminate or reduce the exposure in areas between the intentionally exposed resist areas.

In carrying out work on this development, four samples were used: about 300–400 microns thick silicon (Si) substrate, about 300–400 microns thick gallium arsenide (GaAs) substrate, 200 nm thick silicon nitride ($Si_3N_4$) film on the silicon substrate and 200 nm thick silicon nitride film on the gallium arsenide substrate. The silicon and gallium arsenide substrates were degreased with solvents, etched and then rinsed in water. A commercially available negative resist, SAL-601-ER7, a chemically amplified novlac resin, in thickness of 60 nm, was spun onto the four samples and baked for 30 minutes at 75° C. Following electron beam exposure, the prepared samples were annealed at 107° C. for 7 minutes and then developed in a commercially available developer, MF-622 available from Shipley Company. The resist processing was identical for all samples.

The developed resist patterns were coated with a 10-20 nm thick gold layer and examined in a scanning electron microscope. Low voltage lithographic exposure was made with a scanning tunneling microscope operated in a vacuum. It was operated in the field emission made with the tip or probe with tip-sample voltages of 12 to 50 volts and currents of 10 picoamps to 1 nanoamps. The tip was moved laterally at 500 nm/sec. High voltage exposure was made at 50 keV using JEOL JBX-SDII lithography system operated with a 17 nm 1/e diameter Gaussian probe. Probe diameter was about 10 nm. Arrays of single pass lines and point exposures were written with periods of 100 nm, 250 nm, 500 nm, and 1 um and at line dosage of 0.3nC/cm to 3.3nC/cm or a dot exposure of 0.8 to 40 fC.

At high voltage, for each irradiation dose, the linewidth of the developed resist features was found to vary widely with the substrate material. The strong substrate dependence of the results shows that electron backscattering from the substrate limits the line resolution. A 200 nm free standing membrane, from which little or no backscattered electron dose was expected, dramatically better resolution in linewidths from those observed on substrates.

Results on the dielectric layer disposed on a substrate show a reduction of linewidths and less resist fogging between adjacent features, written at the same dose as those on the bare semiconductor substrates. Since the electrons that are scattered from the substrate are lower in energy than the incident electrons, the dielectric film appears to act as an energy filter for backscattered secondary, and fast secondary electrons. This is an important result for reducing minimum feature sizes and proximity effects on bulk substrates in high resolution electron beam lithography.

Figure 2:
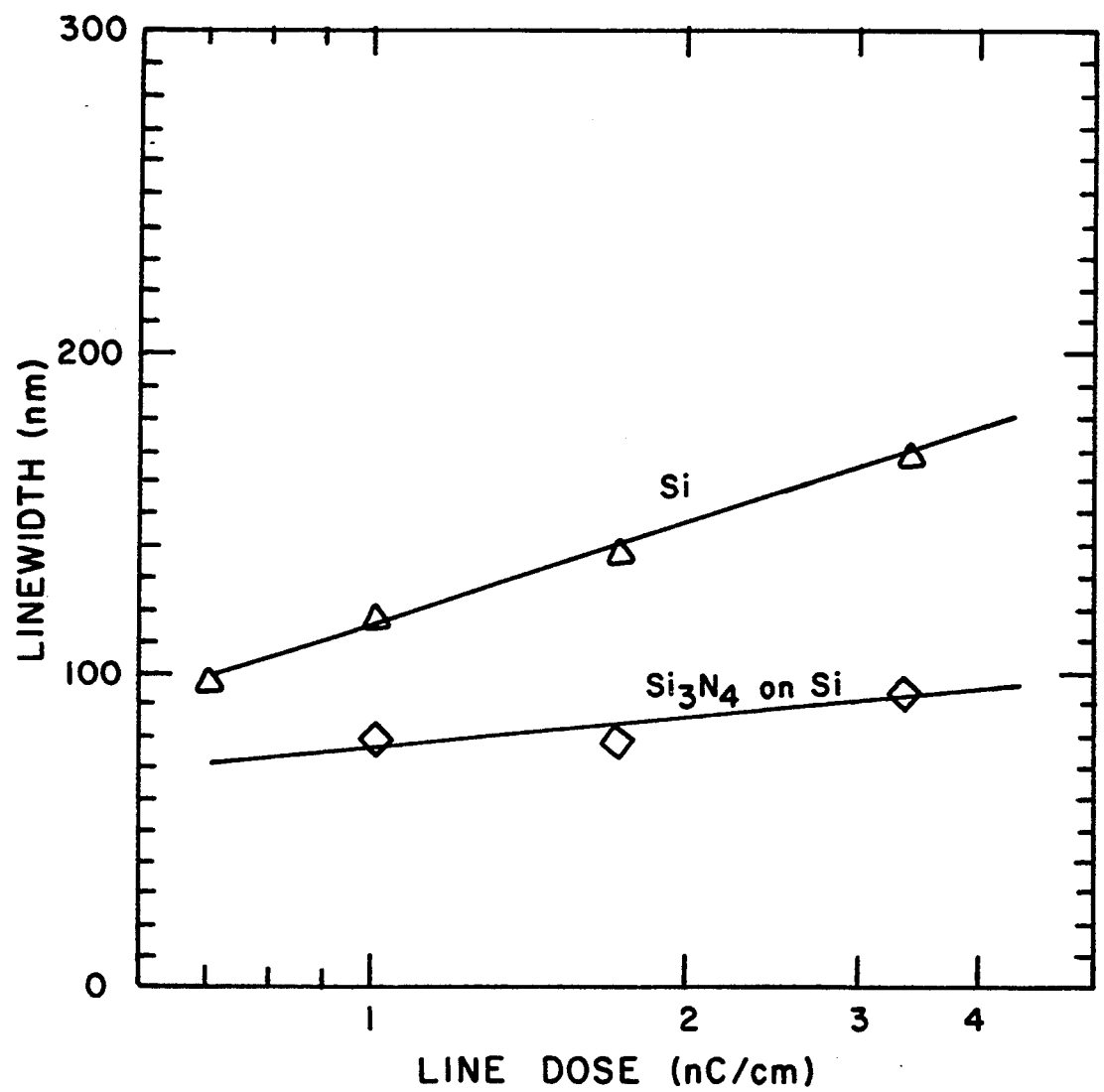
FIG. 2 is a graph of linewidth in nanometers (nm) versus dose in nanocoulombs per centimeter (nC/cm) written with a 50 keV electron beam line dose on silicon substrate.

In terms of specific results, FIG. 2 shows that linewidth at a dose of 1.7 nC/cm on the silicon substrate without the dielectric layer was about 135 nm, whereas with a 200 nm film of silicon nitride dielectric film, the linewidth was only about 80 nm. It is also important to note the slope of the two lines in FIG. 2 shows that the slope of the results on the silicon substrate is much higher than for the results on the silicon substrate with the dielectric layer on it indicating unequivocally that increase in linewidth with dose is much lower on coated substrate than on the uncoated substrate. Additional results show that with a gallium arsenide substrate, in a direct comparison with a silicon substrate, linewidth was 110 nm without the dielectric layer and it was only 80 nm with the silicon nitride dielectric layer at a dose of 0.3 nC/cm. With silicon dioxide ($SiO_2$) dielectric layer 220 nm thick on a gallium arsenide substrate, the linewidth was 250 nm without the dielectric layer and it was 200 nm with the silica or silicon dioxide dielectric layer at exposure of 0.2 nC/cm and with probe diameter of 50 nm.

What is claimed is:

1. A system for making an article of manufacture comprising
   (a) a substrate which is designed to backscatter high voltage electrons,
   (b) a dielectric layer disposed on said substrate said dielectric layer is selected from the group consisting of silicon nitride and silica,
   (c) a single level resist layer disposed on said dielectric layer, and
   (d) a high voltage electron beam source operating at about 1 to 500 keV for directing high voltage electrons at said resist layer, wherein said dielectric layer is designed to produce a linewidth written with said high voltage electron beam on said resist layer disposed on said substrate which is at least 10% less than a linewidth written by said electron beam on said resist layer in absence of said dielectric layer.
2. The system of claim 1 wherein said high voltage source operates at 10 to 100 keV, and thickness of said dielectric layer is about 1 to 1000 nm.
3. The system of claim 2 wherein thickness of said substrate is about 100 to 800 nm, thickness of said dielectric layer is about 10 to 400 nm, and thickness of said resist layer is about 50 to 1000 nm.
4. The system of claim 3 wherein said substrate is selected from silicon and gallium arsenide; said dielectric layer is a nonconductor of electricity having the function of shielding said resist layer from exposure resulting from backscattered electrons and said resist layer is selected from chemically amplified novolac resins.
5. The system of claim 3 wherein said substrate is selected from silicon and gallium arsenide and said resist layer is selected from negative resists.
6. The system of claim 5 wherein said article of manufacture is an integrated circuit.
7. In a lithographic method for enhancing resolution by reducing proximity effects in patterns defined by at least one high voltage electron beam operating at about 1-500 keV on a single level resist layer disposed over a substrate, the improvement comprising the step of interposing a dielectric layer between said resist layer and said substrate which results in a linewidth that is at least 10% less than a linewidth written by said electron beam on said resist layer in absence of said dielectric layer wherein said dielectric layer is selected from the group consisting of silicon nitride and silica.
8. The method of claim 7 further including the step of directing high voltage electrons from an electron beam source at said resist layer; wherein said electron beam source operates at 10 to 100 keV, and the thickness of said dielectric layer is about 1 to 1000 nm.
9. The method of claim 8 wherein thickness of said substrate is about 100 to 800 nm and thickness of said dielectric layer is about 10 to 400 nm.
10. The method of claim 9 wherein said substrate is selected from alumina, beryllia, porcelain-enameled metals, co-fired porcelain ceramics, glass, quartz, oxidized silicon, sapphire, and ferrite and said resist layer is selected from chemically amplified nonolac resists.
11. The method of claim 9 wherein said substrate is selected from silicon and gallium arsenide and said resist layer is selected from negative resists.
12. A system for making an article of manufacture, said system comprising
   (a) a substrate about 100-800 nm thick which is designed to backscatter high voltage electrons, said substrate is selected from the group consisting of silicon and gallium arsenide;
   (b) a dielectric layer about 10-400 nm thick disposed on said substrate, said dielectric layer is selected from the group consisting of silicon nitride and silica;
   (c) a single level resist layer about 50-1000 nm thick disposed on said dielectric layer, said resist layer is selected from negative resists; and (d) a high voltage electron beam source operating at about 10 to 100 keV for directing high voltage electrons at said resist layer; wherein said dielectric layer is designed to produce a linewidth of a lithographic pattern that is at least 10% less than a linewidth of a lithographic pattern written by said electron beam source on said article of manufacture without said dielectric layer.

13. A system for making an article of manufacture, said system comprising
(a) a substrate about 100–800 nm thick which is designed to backscatter high voltage electrons, said substrate is selected from the group consisting of silicon and gallium arsenide;
(b) a dielectric layer about 10–400 nm thick disposed on said substrate, said dielectric layer is selected from the group consisting of silicon nitride and silica;
(c) a single level resist layer about 50–1000 nm thick disposed on said dielectric layer; and
(d) a high voltage electron beam source operating at about 10 to 100 keV for directing high voltage electrons at said resist layer, wherein said dielectric layer is designed to produce a linewidth of a lithographic pattern that is at least 10% less than a linewidth of a lithographic pattern written by said electron beam source on said article of manufacture without said dielectric layer.

* * * * *